US006914255B2

(12) United States Patent
Lowrey (10) Patent No.: US 6,914,255 B2
(45) Date of Patent: Jul. 5, 2005

(54) PHASE CHANGE ACCESS DEVICE FOR MEMORIES

(75) Inventor: Tyler A. Lowrey, West Augusta, VA (US)

(73) Assignee: Ovonyx, Inc., Boise, ID (US)

( * ) Notice: Subject to any disclaimer, the term of this patent is extended or adjusted under 35 U.S.C. 154(b) by 74 days.

(21) Appl. No.: 10/634,140

(22) Filed: Aug. 4, 2003

(65) Prior Publication Data

US 2005/0029505 A1 Feb. 10, 2005

(51) Int. Cl.$^7$ .............................................. H01L 47/00
(52) U.S. Cl. ............................... 257/5; 257/2; 257/42; 257/613; 365/100; 365/163; 365/154; 365/175; 438/102; 438/400
(58) Field of Search .......................... 257/5, 2, 42, 613; 438/102, 900; 365/100, 163, 154, 175

(56) References Cited

U.S. PATENT DOCUMENTS

| | | | | |
|---|---|---|---|---|
| 5,978,258 A | * | 11/1999 | Manning | 365/175 |
| 6,579,760 B1 | | 6/2003 | Lung | 438/257 |
| 6,590,807 B2 | * | 7/2003 | Lowrey | 365/175 |
| 6,707,712 B2 | * | 3/2004 | Lowery | 365/175 |
| 6,795,338 B2 | * | 9/2004 | Parkinson et al. | 365/163 |
| 6,816,404 B2 | * | 11/2004 | Khouri et al. | 365/163 |
| 2003/0001230 A1 | | 1/2003 | Lowrey | 257/529 |

FOREIGN PATENT DOCUMENTS

| | | |
|---|---|---|
| DE | 251 225 | 11/1987 |
| WO | WO 99/44258 | 9/1999 |
| WO | WO 2004/055828 | 7/2004 |
| WO | WO 2004/055899 | 7/2004 |

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS–Compatible Phase–Change Nonvolatile RAM Using NMOS Cell Transistors," presented at 2003 $19^{th}$ IEEE Non–Volatile Semiconductor Memory Workshop, Monterey, California, Feb. 26–20, 2003.

Ha, Y.H., Yi, J.H., Horii, H., Park, J.H., Joo, S.H., Park, S.O., Chung, U–In and Moon, J.T., "An Edge Contact Type Cell for Phase Change RAM Featuring Very Low Power Consumption," presented at IEEE 2003 Symposium on VLSI Technology, Kyoto, Japan, Jun. 12–14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase–change RAM Based on 0.24 mm–CMOS Technologies," presented at IEEE 2003 Symposium on VLSI Technology, Kyoto, Japan, Jun. 12–14, 2003.

Horii, H.,Yi, J.H., Park, J.H., Ha, Y.H., Baek, I.G., Park, S.O., Hwang, Y.N., Lee, S.H., Kim, Y.T., Lee, K.H., Chung, U–In and Moon, J.T., "A Novel Cell Technology Using N–doped GeSbTe Films for Phase Change RAM," presented at IEEE 2003 Symposium on VLSI Technology, Kyoto, Japan, Jun. 12–14, 2003.

* cited by examiner

Primary Examiner—Nathan J. Flynn
Assistant Examiner—Remmon R. Fordé
(74) Attorney, Agent, or Firm—Trop, Pruner & Hu, P.C.

(57) ABSTRACT

A memory may have access devices formed using a chalcogenide material. The access device does not induce a snapback voltage sufficient to cause read disturbs in the associated memory element being accessed. In the case of phase change memory elements, the snapback voltage may be less than the threshold voltage of the phase change memory element.

21 Claims, 10 Drawing Sheets

PHASE CHANGE ACCESS DEVICE FOR MEMORIES

BACKGROUND

This invention relates generally to memories utilized to store electronic information.

Generally, memories may include cells or bits arranged in rows and columns such that they may be individually accessed for reading, erasing, and programming. To this end, an access device, sometimes called a selection device, is provided to enable an individual bit on an individual row or column to be accessed. Thus, the row or column may include a number of cells or bits and one individual bit or cell along that column or row may be accessed by activating its access device.

Commonly, access devices are transistors or diodes. However, such access devices are formed in a semiconductor substrate. As a result, valuable real estate on the integrated circuit may be consumed for forming such access devices.

Thus, there is a need for better ways to access cells or bits in memories.

DETAILED DESCRIPTION

Figure 1:
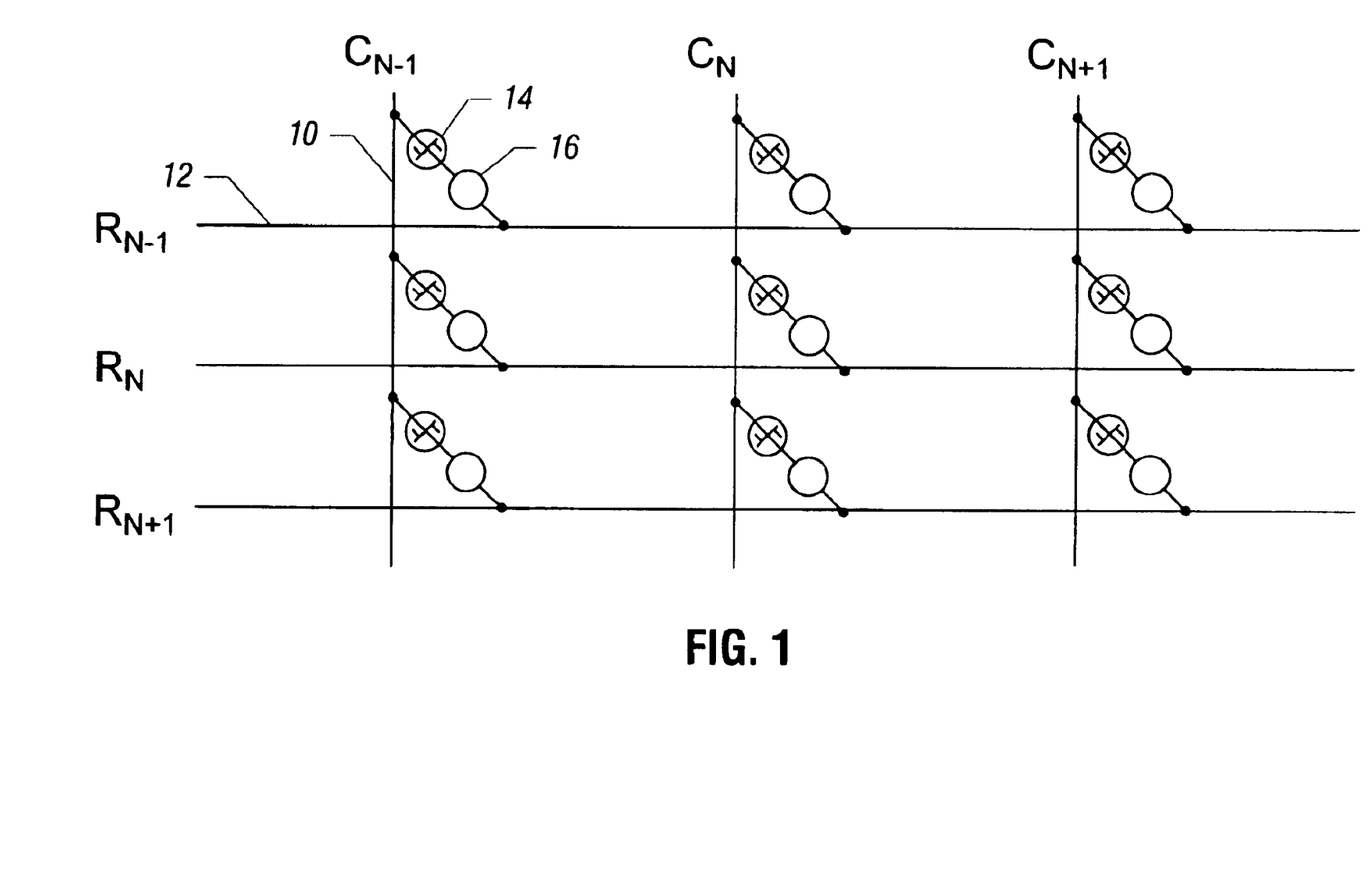
FIG. 1 is a depiction of a memory array in accordance with one embodiment of the present invention.

Referring to FIG. 1, a portion of a memory array arranged in columns 10 and rows 12 is illustrated. Each cell may include a memory element 16 and an access device 14. While the access device 14 is shown between the memory element 16 and a column 10, similarly, the access device 14 may be positioned between the memory element 16 and the row 12 in other embodiments. While the terms "rows" and "columns" are used herein, these terms are in a sense arbitrary and these terms refer to any conductive line used to address a memory element 16.

In accordance with one embodiment of the present invention, the access device 14 may use a chalcogenide material. In some embodiments, the memory element 16 may also use a phase change material, but the present invention is not so limited and other memory elements, including a wide variety of thin film memory elements, may be utilized including metal oxide memory elements and paraelectric memory elements, to mention two examples.

In order to select an element 16 on column CN and row RN, the access device 14 for the selected memory element 16 at that location may be operated. The access device 14 activation allows current to flow through the memory element 16 in one embodiment of the present invention.

Figure 2:
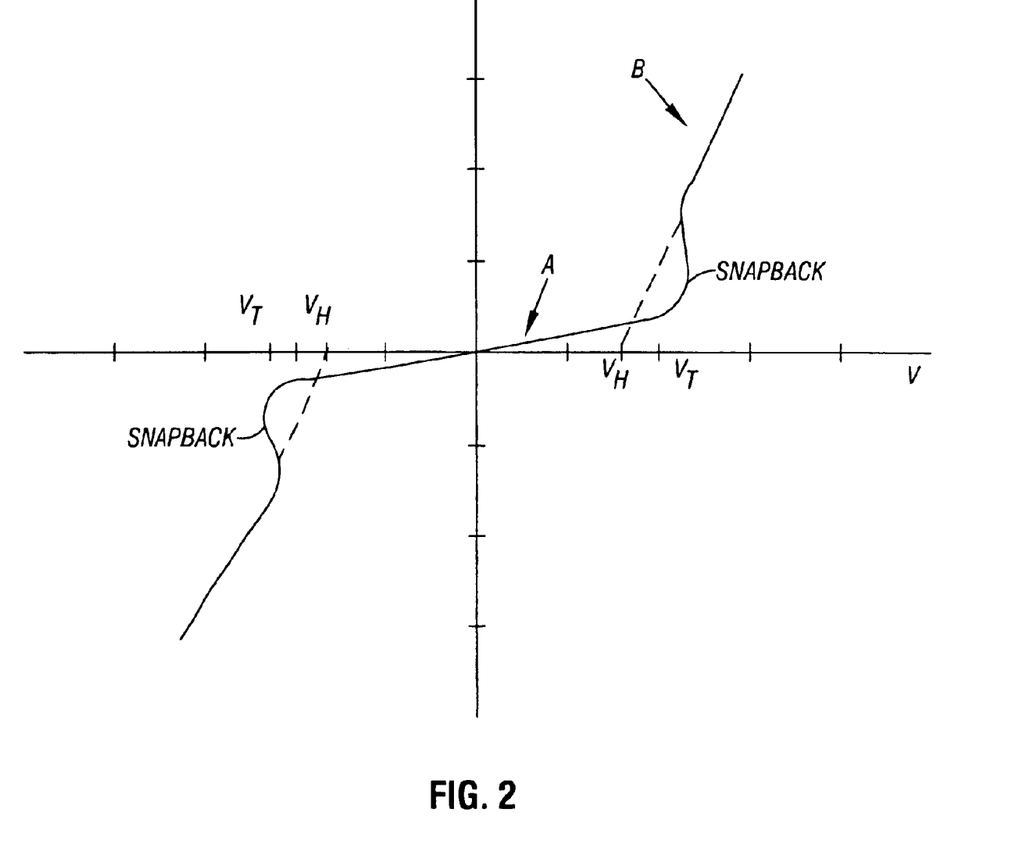
FIG. 2 is a hypothetical or illustrative plot of current versus voltage for an access device in accordance with one embodiment of the present invention.

Referring to FIG. 2, a hypothetical or illustrative current versus voltage characteristic of the access device 14 is illustrated. In a low voltage or low field regime A, the device 14 is off and exhibits very high resistance in some embodiments. The off resistance can, for example, range from 100,000 ohms to greater than 10 gigaohms at a bias of half the threshold voltage. The device 14 may remain in its off state until a threshold voltage $V_T$ or threshold current $I_T$ switches the device 14 to a highly conductive, low resistance on state. The voltage across the device 14 after turn on drops to a slightly lower voltage, called the holding voltage $V_H$ and remains very close to the threshold voltage. In one embodiment of the present invention, as an example, the threshold voltage may be on the order of 1.1 volts and the holding voltage may be on the order of 0.9 volts.

After passing through the snapback region, in the on state, indicated at B, the device 14 voltage drop remains close to the holding voltage as the current passing through the device is increased up to a certain, relatively high, current level. Above that current level the device remains on but displays a finite differential resistance with the voltage drop increasing with increasing current. The device 14 may remain on until the current through the device 14 is dropped below a characteristic holding current value that is dependent on the size and the material utilized to form the device 14.

The snapback voltage is effectively the threshold voltage minus the holding voltage. By reducing the extent of the snapback voltage, read disturbs in the memory element 16 can be reduced. If the snapback voltage is sufficiently small, read disturbs can be avoided. In one embodiment of the present invention, the snapback voltage is reduced to that level that avoids read disturb problems in the associated memory element 16. In an embodiment where the memory element 16 also uses phase change material, the snapback voltage may be less than the threshold voltage of the memory element 16.

One advantage, in some embodiments, of using a chalcogenide material to form the access device 14 is that the access device 14 need not be formed in a semiconductor substrate. As a result, in some embodiments, stacks of memory arrays of the type shown in FIG. 1 may be positioned one above the other since access devices need not be present within the substrate.

In some embodiments of the present invention, the access device 14 does not change phase. It remains permanently amorphous and its current-voltage characteristics may remain the same throughout its operating life.

As an example, for a 0.5 micrometer diameter device 14 formed of TeAsGeSSe having respective atomic percents of 16/13/15/1/55, the holding current may be on the order of 0.1 to 100 micro-ohms in one embodiment. Below this holding current, the device 14 turns off and returns to the high resistance regime at low voltage, low field. The threshold current for the device 14 may generally be of the same order as the holding current. The holding current may be altered by changing process variables, such as the top and bottom electrode material and the chalcogenide material. The device 14 may provide high "on current" for a given area of device compared to conventional access devices such as metal oxide semiconductor field effect transistors or bipolar junction transistors.

In some embodiments, the higher current density of the device 14 in the on state allows for higher programming current available to the memory element 16. Where the memory element 16 is a phase change memory, this enables the use of larger programming current phase change memory devices, reducing the need for sub-lithographic feature structures and the commensurate process complexity, cost, process variation, and device parameter variation.

Figure 3:
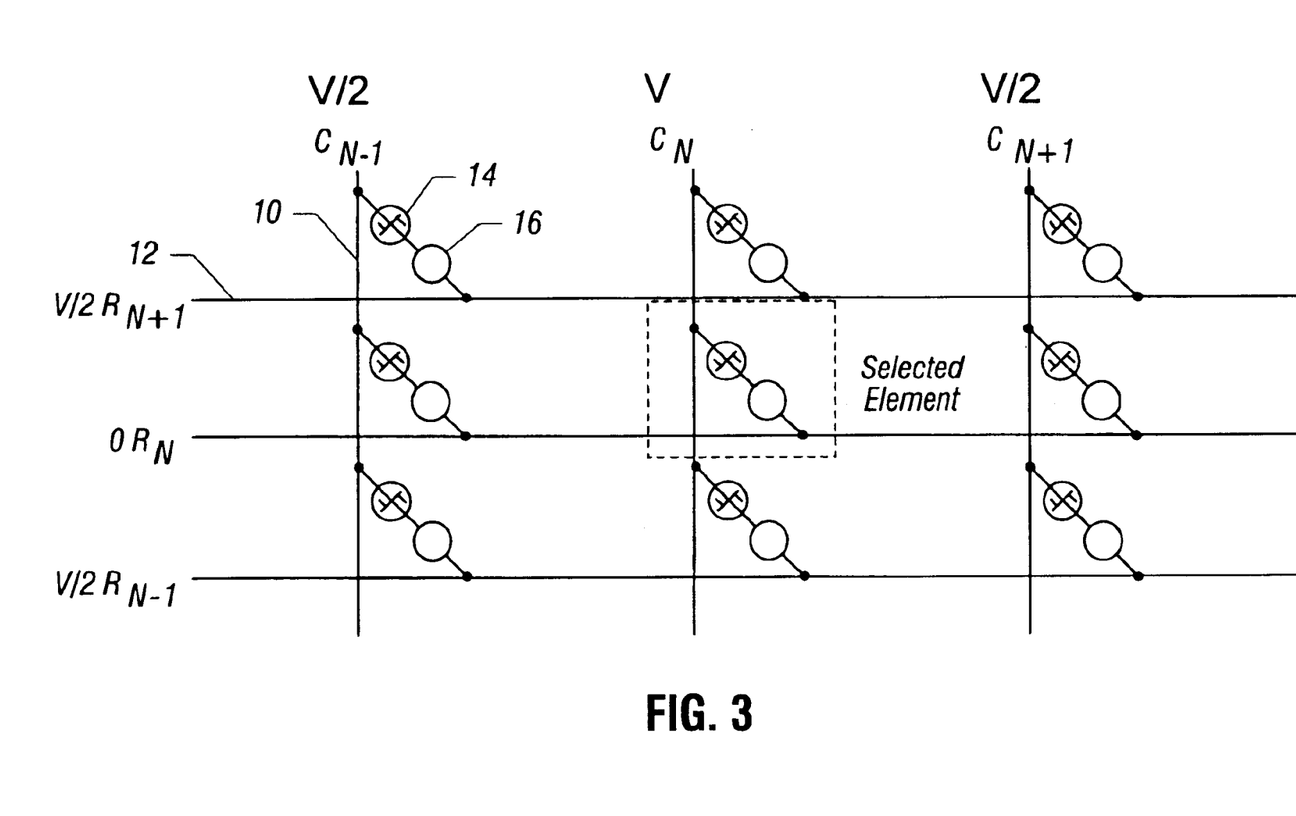
FIG. 3 is a depiction of a biasing scheme in accordance with one embodiment of the present invention.

Referring to FIG. 3, one technique for addressing the array uses a voltage V applied to the selected column and a zero voltage applied to the selected row. For the case where the device 16 is a phase change memory, the voltage V is chosen to be greater than the device 14 maximum threshold voltage plus the memory element 16 reset maximum threshold voltage, but less than two times the device 14 minimum threshold voltage. In other words, the maximum threshold voltage of the device 14 plus the maximum reset threshold voltage of the device 16 may be less than V and V may be less than two times the minimum threshold voltage of the device 14 in some embodiments. All of the unselected rows and columns may be biased at V/2.

With this approach, there is no bias voltage between the unselected rows and unselected columns. This reduces background leakage current.

After biasing the array in this manner, the memory elements 16 may be programmed and read by whatever means is needed for the particular memory technology involved. A memory element 16 that uses a phase change material may be programmed by forcing the current needed for memory element phase change or the memory array can be read by forcing a lower current to determine the device 16 resistance.

Figure 4:
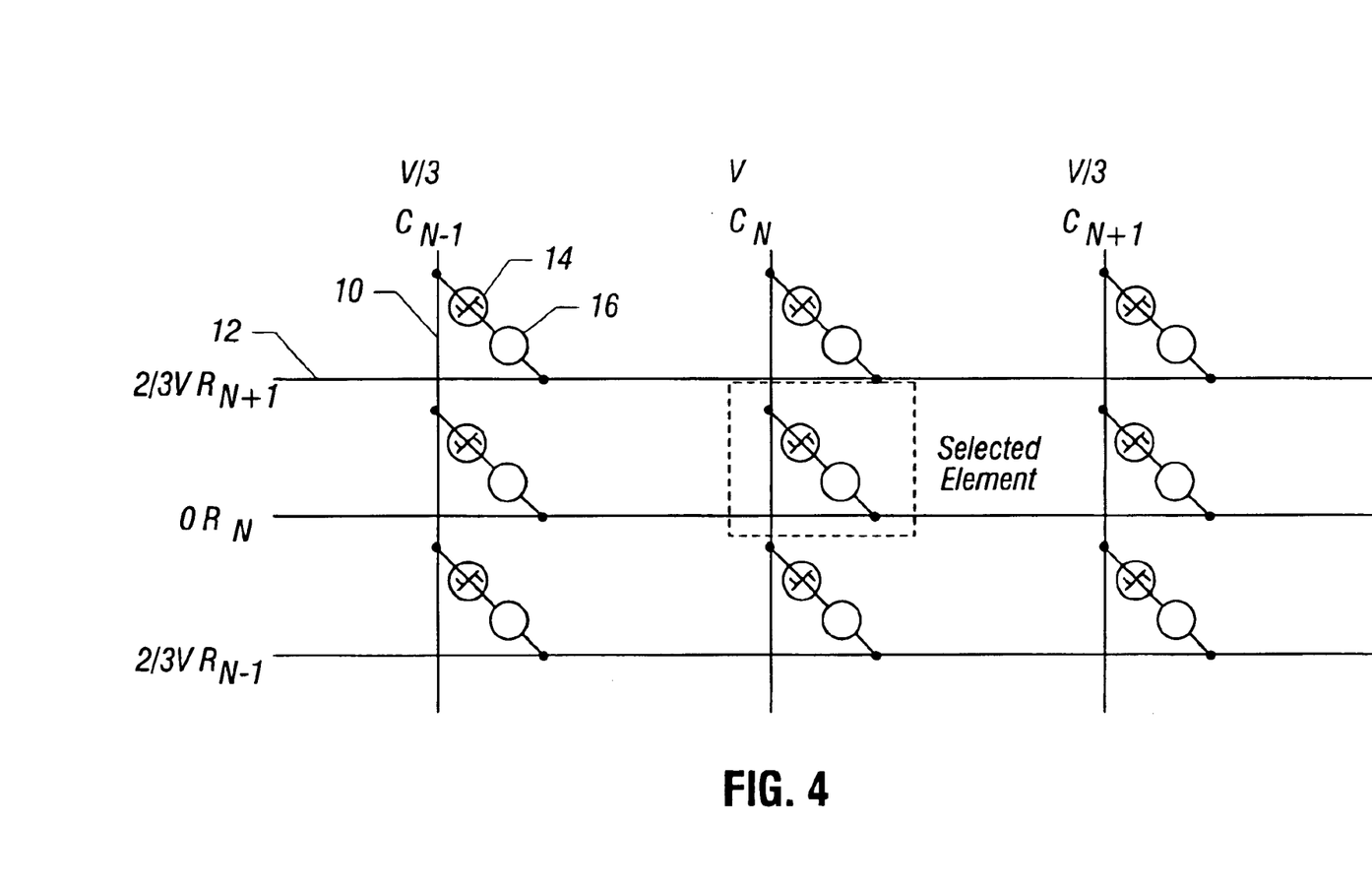
FIG. 4 is a depiction of another biasing scheme in accordance with one embodiment of the present invention.

In accordance with another embodiment of the present invention, shown in FIG. 4, the voltage V is applied to the selected column and zero volts is applied to the selected row. For the case of a memory element 16 that is a phase change memory, V may be chosen to be greater than the device 14 maximum threshold voltage plus the device 16 maximum reset threshold voltage, but less than three times the device 14 minimum threshold voltage. In other words, the maximum threshold voltage of the device 14, plus the maximum reset threshold voltage of the device 14, may be less than V and V may be less than three times the minimum threshold voltage of the device 14. All unselected rows are biased at two-thirds V. All unselected columns may be biased at one-third V.

With this approach, there is a voltage bias between unselected rows and unselected columns of plus and minus V/3. This may contribute to additional background leakage current relative to the embodiments shown in FIG. 3. However, additional manufacturing margin may be provided for variability of threshold voltage in some embodiments.

After biasing the array in this manner, the memory element 16 can be programmed and read by whatever means is appropriate for the particular memory technology involved. A memory 16 using a phase change material may be programmed by forcing the current needed for the memory element to change phase or the memory array can be read by forcing a lower current to determine device resistance.

For the case of a phase change memory element 16, programming a given selected bit in an array can be as follows. Unselected rows and columns may be biased as shown in FIG. 3 or 4. Zero volts is applied to the selected row. A current is forced on the selected column with a compliance that is greater than the maximum threshold voltage of the device 14 plus the maximum threshold voltage of the device 16. The current amplitude, duration, and pulse shape may be selected to place the memory element 16 in the desired phase and thus, the desired memory state.

Reading a phase change memory element 16 can be performed as follows. Unselected rows and columns may be biased as shown in FIG. 3 or 4. Zero volts is applied to the selected row. A voltage is forced at a value greater than the maximum threshold voltage of the device 14, but less than the minimum threshold voltage of the device 14 plus the minimum threshold voltage of the element 16 on the selected column. The current compliance of this forced voltage is less than the current that could program or disturb the present phase of the memory element 16. If the phase change memory element 16 is set, the access device 14 switches on and presents a low voltage, high current condition to a sense amplifier. If the device 16 is reset, a larger voltage, lower current condition may be presented to the sense amplifier. The sense amplifier can either compare the resulting column voltage to a reference voltage or compare the resulting column current to a reference current.

The above-described reading and programming protocols are merely examples of techniques that may be utilized. Other techniques may be utilized by those skilled in the art.

To avoid disturbing a set bit of memory element 16 that is a phase change memory, the peak current may equal the threshold voltage of the device 14 minus the holding voltage of the device 14 that quantity divided by the total series resistance including the resistance of the device 14, external resistance of device 16, plus the set resistance of device 16. This value may be less than the maximum programming current that will begin to reset a set bit for a short duration pulse.

A technique for manufacturing the devices 14 and 16, where both devices use chalcogenide material, that is particularly amenable to forming stacked arrays, is illustrated in FIGS. 5 through 12. It should be understood that this fabrication process is for illustration purposes only and the present invention is in no way limited to those particular techniques.

Figure 5:
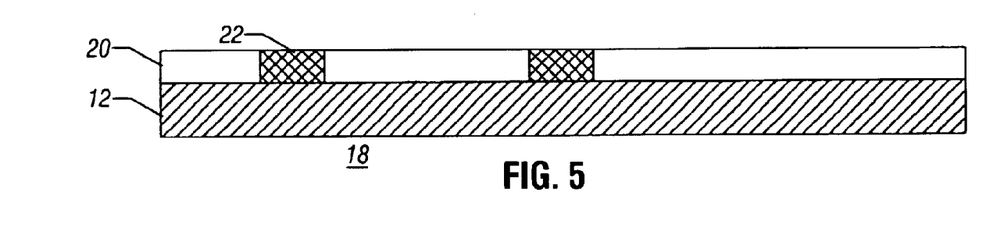
FIG. 5 is an enlarged, cross-sectional view at an early stage of manufacture of the memory array shown in FIG. 1.

Referring to FIG. 5, initially, a substrate 18 may have a layer of metal 12 deposited on it. In some embodiments, the layer 12 may be aluminum and may ultimately form a rowline in a memory array. In some embodiments, it may be desirable to form the device 16 under the device 14, but in other embodiments the order may be switched. In this embodiment, device 16 is formed under device 14.

Over the layer 12, a layer of dielectric 20 may be formed which, in one embodiment, may be oxide. A number of bottom electrodes 22 may be defined in the dielectric layer 20. In some embodiments, the electrodes 22 may be titanium silicon nitride. In such case, the electrodes 22 may ultimately act as heaters for a phase change material to be added subsequently.

Figure 6:
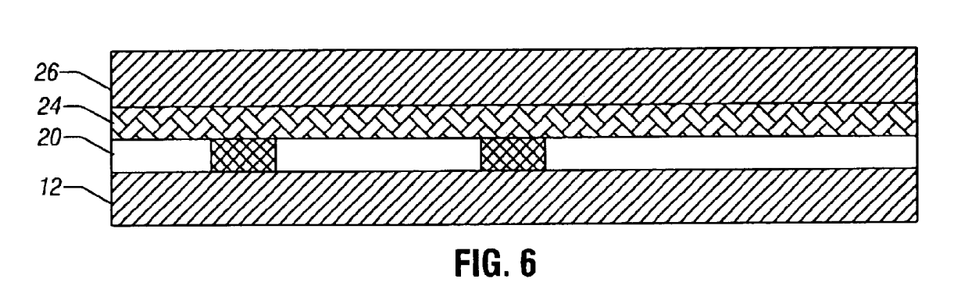
FIG. 6 is an enlarged, cross-sectional view at a subsequent stage of manufacture in accordance with one embodiment of the present invention.

Referring to FIG. 6, the phase change material 24 may be positioned over the electrodes 22 and the dielectric 20. Over the phase change material 24 may be the electrode 26. The electrode 26 may a thin film of titanium, titanium nitride, titanium tungsten, carbon, silicon carbide, titanium aluminum nitride, titanium silicon nitride, polycrystalline silicon, tantalum nitride, some combination of these films, or other suitable conductors or resistive conductors compatible with the layer 24. The layer 26 may advantageously be TiSiN or carbon.

Figure 7:
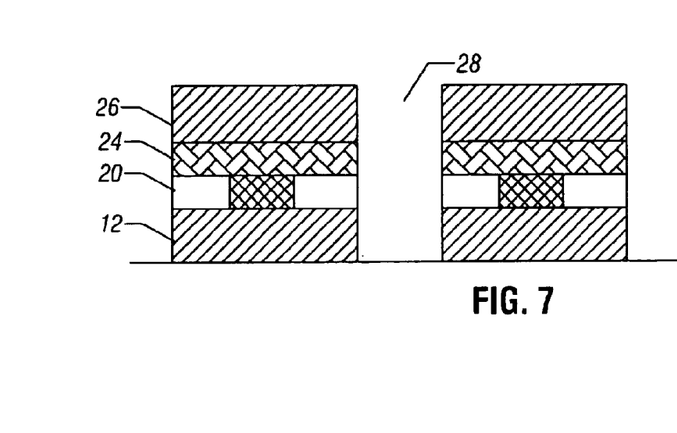
FIG. 7 is an enlarged, cross-sectional view at a subsequent stage of manufacture in accordance with one embodiment of the present invention.

In one embodiment of the present invention, the structure that forms the memory element 16 may then be etched into a number of parallel lines and spaces (stripes) in the rowline direction, with the space between rowlines 28, shown in FIG. 7.

Figure 8:
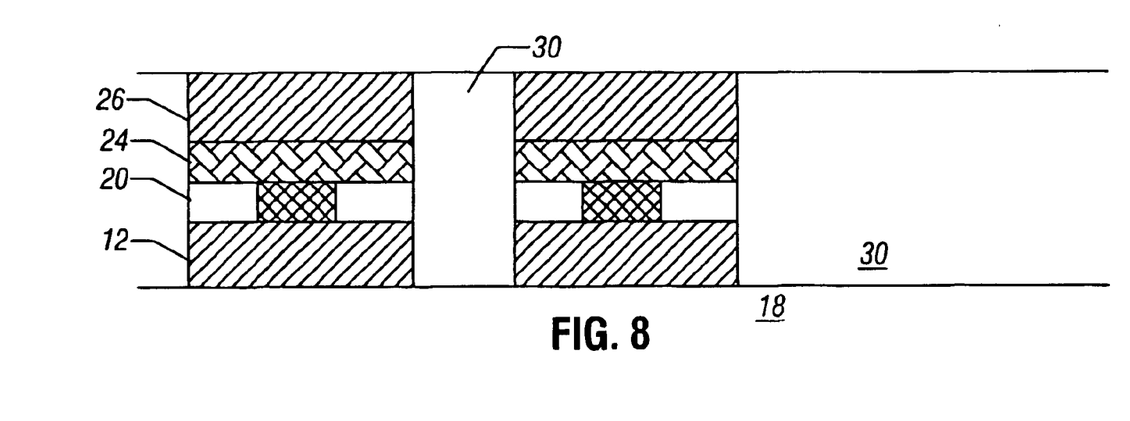
FIG. 8 is an enlarged, cross-sectional view at a subsequent stage of manufacture in accordance with one embodiment of the present invention.

Referring to FIG. 8, the spaces 28 may then be filled with a dielectric such as high density plasma oxide and subjected to chemical mechanical planarization.

In one embodiment, the phase change material 24 may be a phase change material suitable for non-volatile memory data storage. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information.

In one embodiment, the memory material may be chalcogenide element composition from the class of tellurium-germanium-antimony ($Te_xGe_ySb_z$) material or a GeSbTe alloy, although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to one of at least two resistance values within a range of resistance values to provide single bit or multi-bit storage of information.

Programming of the memory material to alter the state or phase of the material may be accomplished by applying voltage potentials to the layers 12 and 26, thereby generating a voltage potential across the memory material 24. An electrical current may flow through a portion of the memory material 24 in response to the applied voltage potentials, and may result in heating of the memory material 24.

This heating and subsequent cooling may alter the memory state or phase of the memory material 24. Altering the phase or state of the memory material 24 may alter an electrical characteristic of the memory material 24. For example, resistance of the material 24 may be altered by altering the phase of the memory material 24. The memory material may also be referred to as a programmable resistive material or simply a programmable material.

In one embodiment, a voltage potential difference of about 0.5–1.5 volts may be applied across a portion of the memory material by applying about 0 volts to a lower layer 12 and about 0.5–1.5 volts to an upper layer 26. A current flowing through the memory material 24 in response to the applied voltage potentials may result in heating of the memory material. This heating and subsequent cooling may alter the memory state or phase of the material.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material may be heated to a relatively higher temperature to amorphize the memory material and "reset" memory material (e.g., program memory material to a logic "0" value). Heating the volume or memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

The information stored in memory material 24 may be read by measuring the resistance of the memory material. As an example, a read current may be provided to the memory material using opposed layers 12, 26 and a resulting read voltage across the memory material 24 may be compared against a reference voltage using, for example, a sense amplifier (not shown). The read voltage may be proportional to the resistance exhibited by the memory storage element. Thus, a higher voltage may indicate that memory material is in a relatively higher resistance state, e.g., a "reset" state. A lower voltage may indicate that the memory material is in a relatively lower resistance state, e.g., a "set" state.

Figure 9:
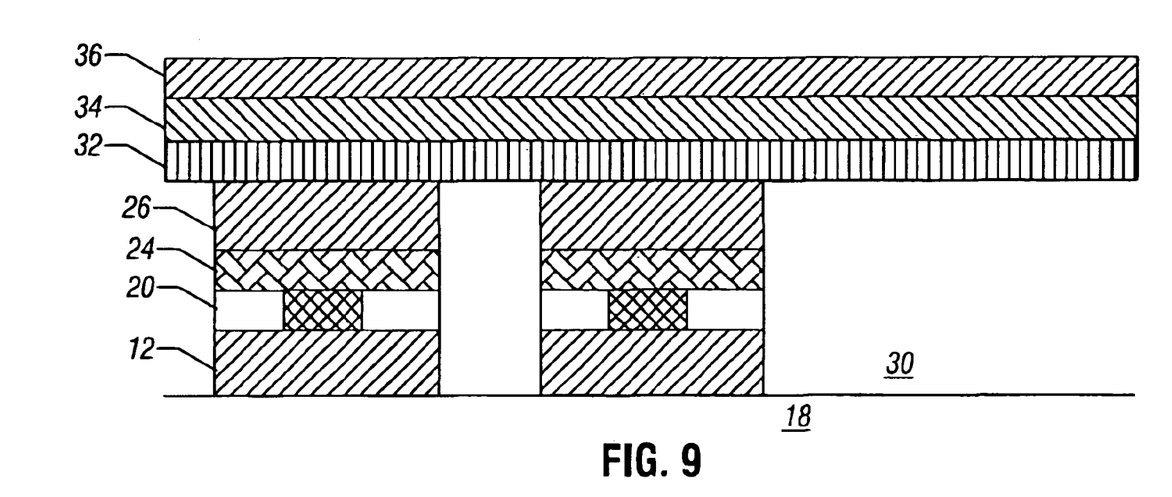
FIG. 9 is an enlarged, cross-sectional view at a subsequent stage of manufacture in accordance with one embodiment of the present invention.

Moving to FIG. 9, in one embodiment, the fabrication of the access device 14 begins by depositing a layer of threshold material 32, followed by a layer of top electrode 34, followed by a conductive layer 36. In some embodiments of the present invention, the top electrode 34 may be a thin film of titanium, titanium nitride, titanium tungsten, carbon, silicon carbide, titanium aluminum nitride, titanium silicon nitride, polycrystalline silicon, tantalum nitride, some combination of these films, or other suitable conductors or resistive conductors compatible with the layer 32. In some embodiments it is most advantageous for the top electrode 34 to be formed of carbon or titanium silicon nitride. The thickness of the top electrode 34, in some embodiments, may be in the range of 20 to 2000 Angstroms and most advantageously, in one embodiment, 500 Angstroms.

Under the top electrode 34 is the material 32 that may be a chalcogenide material. An example of such a material is SiTeAsGeX in an atomic percent ratio of 14/39/37/9/1 where X is indium or phosphorous. Another example is SiTeAsGeSSe in the atomic percent ratio of 5/34/28/11/21/1. Still another example is TeAsGeSSe in the atomic percent of 16/13/15/1/55.

The material 32 may be made relatively thin so that The holding voltage is close to the threshold voltage. The thickness of the material 32 may be in the range of about 20 to about 500 Angstroms in some embodiments and most advantageously about 200 Angstroms in one embodiment.

Figure 10:
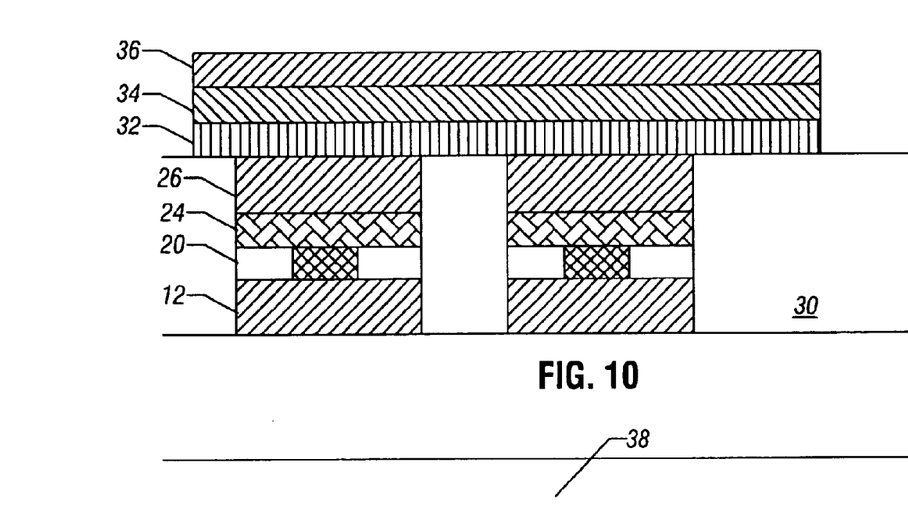
FIG. 10 is an enlarged, cross-sectional view at a subsequent stage of manufacture in accordance with one embodiment of the present invention.

Referring to FIG. 10, the structure shown in FIG. 9 may then be patterned into elongated columns. Layers 36, 34, 32, 26, and 24 may be patterned in a self-aligned sequential etch for all these layers (elongated columns). Since the layers 26 and 24 were patterned in row stripes at an earlier step, the result is a square isolated region for layers 26 and 24 forming an isolated phase change memory device at each row/column intersection. For the access devices 14, there may be no substantial current leakage in some embodiments between adjacent cells along the same column even though no isolation layer is provided between the access device 14 because of the relatively high resistance of the material 32.

Figure 11:
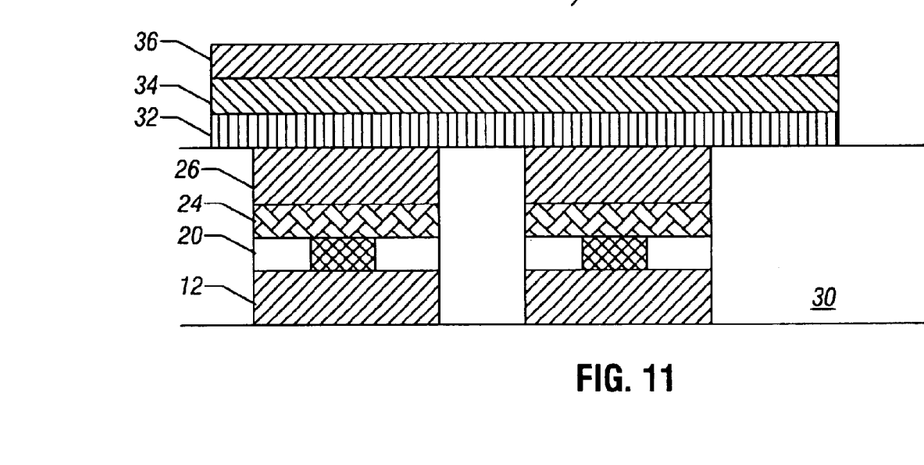
FIG. 11 is an enlarged, cross-sectional view at a subsequent stage of manufacture in accordance with one embodiment of the present invention.

Referring to FIG. 11, the structure shown in FIG. 10 may then be covered with an insulator 38, such as high density plasma oxide, followed by chemical mechanical planarization in some embodiments.

Figure 12:
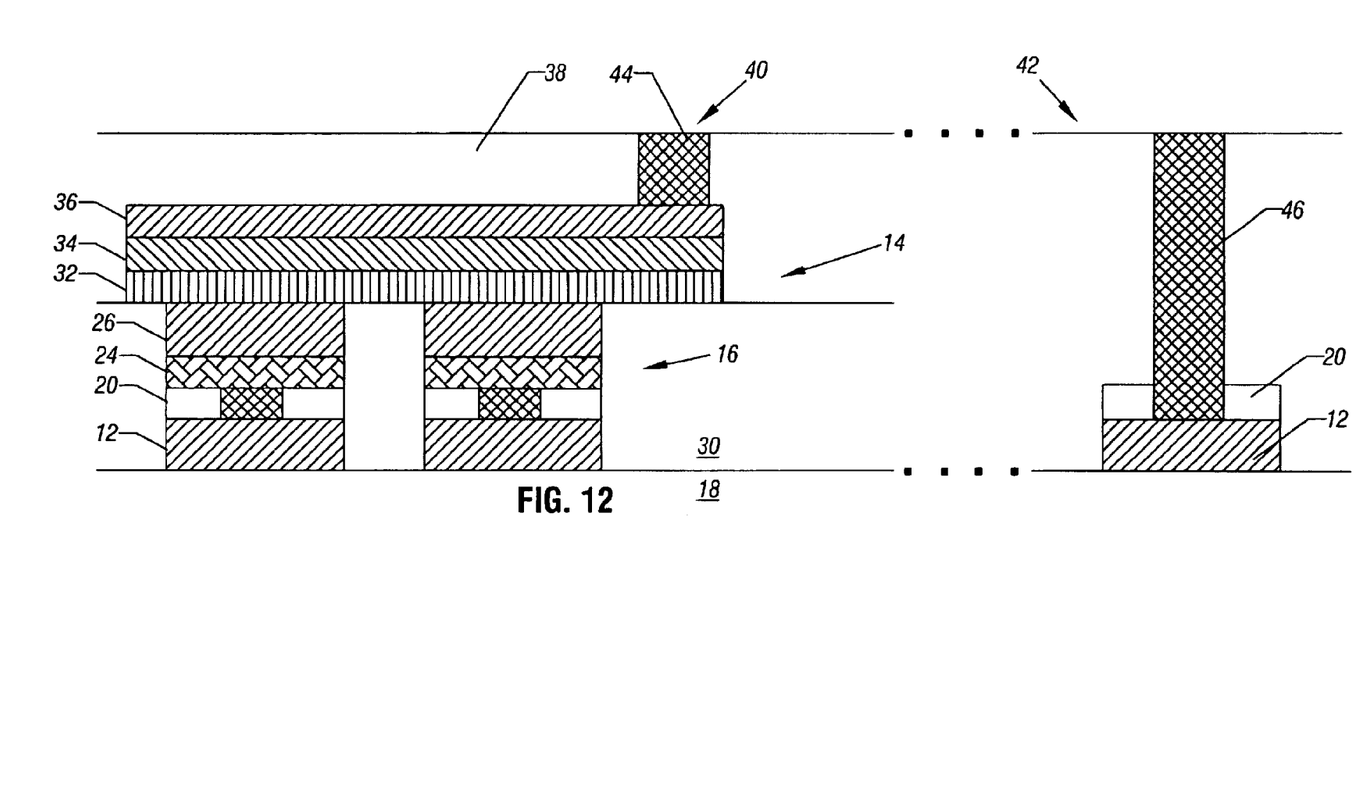
FIG. 12 is an enlarged, cross-sectional view at a subsequent stage of manufacture in accordance with one embodiment of the present invention.

Then, referring to FIG. 12, plugs 44 may formed in the memory array 40 to enable electrical connection to the conductors 36. In the periphery 42, plugs 46 may be provided down to the layer 12 that couples to the electrodes 22 of the element 16. As a result, each column and row of the array 40 may be addressed from above in one embodiment.

Appropriate metal connections may enable each row 12 of each element 16 to be coupled to receive appropriate electrical potentials for biasing, reading, programming from an overlying conductive line (not shown) via the plugs 46. Thus, a large number of the plugs 46 may be provided.

Similarly, each column of devices 14 may include a plug 44 which, through patterning of the layer 36, may provide individual connections to each column of devices 14.

Figure 13:
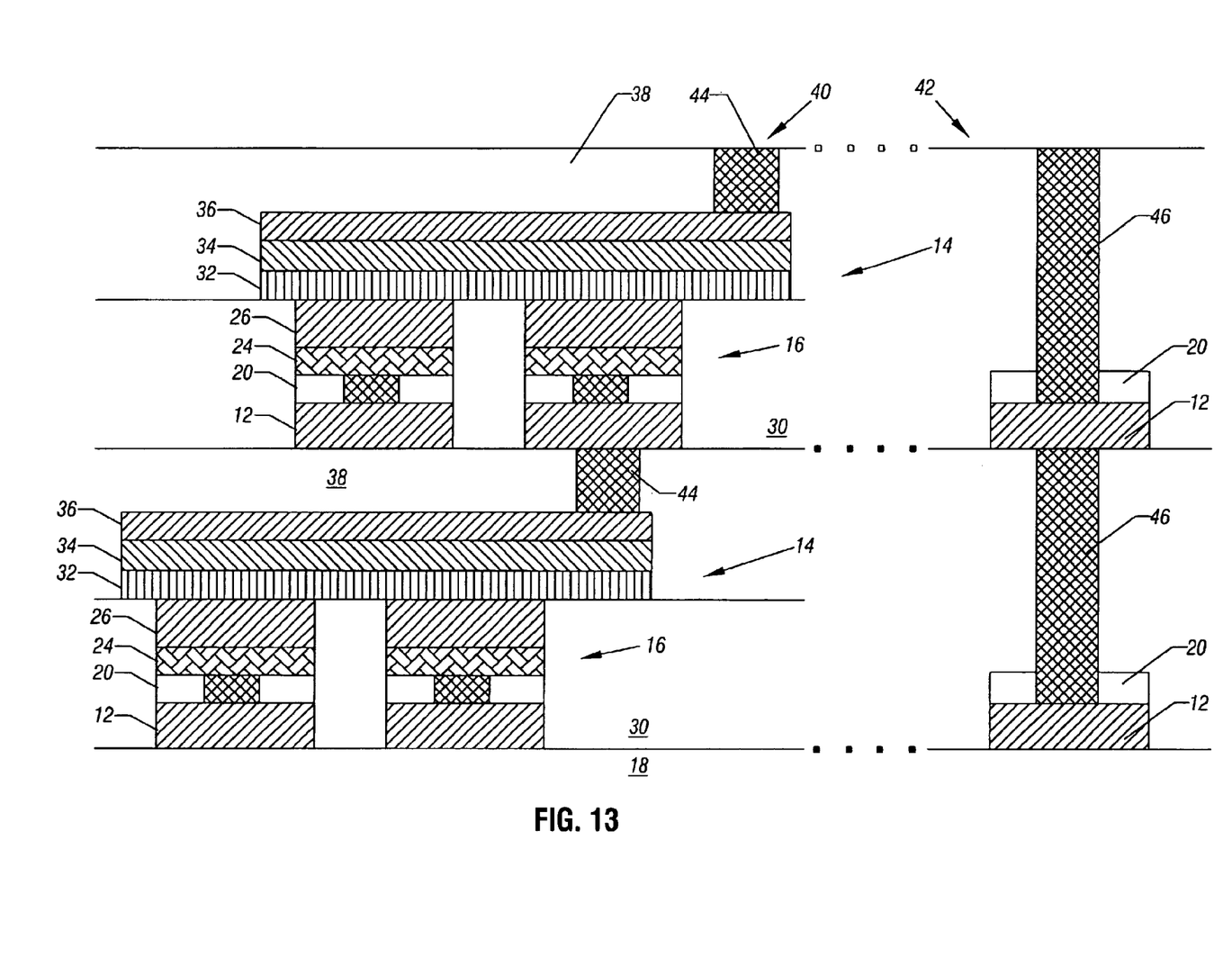
FIG. 13 is an enlarged, cross-sectional view of a stack of arrays.

Referring to FIG. 13, a stacked structure made up of two separate memory arrays, one above the other, is illustrated. Each array includes a plurality of memory elements 16 and associated access devices 14 arranged in rows and columns. By suitably patterning the associated metallization layers 12 and 36, potentials can be applied individually to each cell of the overlying array or underlying array uniquely using the cell's corresponding row or column for the overlying array or the underlying array. The sequence of stacked memory arrays may be implemented in two or more layers.

As a result of the configuration shown in FIG. 13, the underlying substrate 18 is effectively largely unused. Instead of populating the substrate 18 with access devices, it can be devoted to providing row and column decoders, sense amplifiers, cache memory, and other functions underneath the memory array 40.

While an embodiment with a single access device 14 per cell or bit is illustrated, it is possible to use two or more access devices in series per bit or cell. This results in access devices 14 with effectively higher holding voltages and threshold voltages. For example, for a series combination of access devices, a combined threshold of about 3 volts and a combined holding voltage of about 2.8 volts may be achieved. More than two access devices may also be placed in series. Devices with different individual threshold voltages and holding voltages may be utilized to achieve a desirable targeted combination of holding and threshold voltages.

Figure 14:
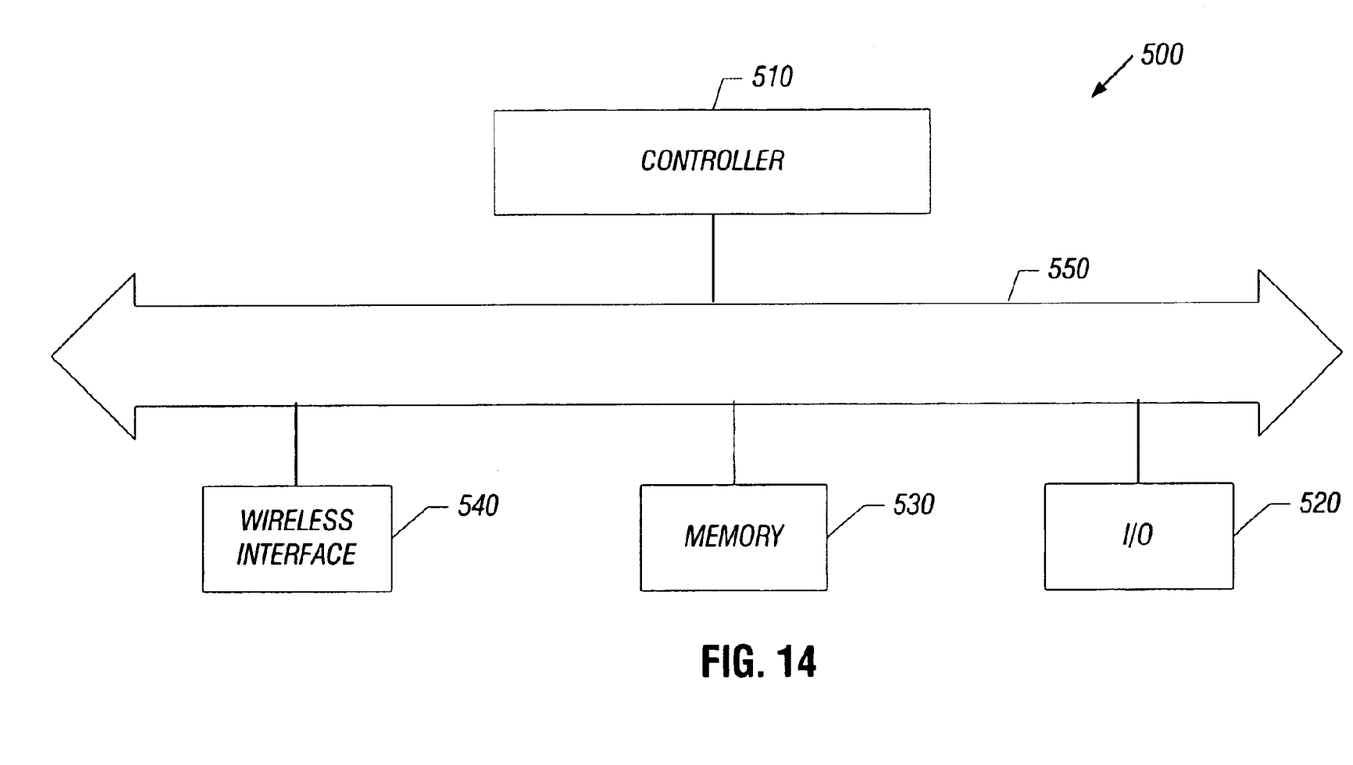
FIG. 14 is a system depiction in accordance with one embodiment of the present invention.

Turning to FIG. 14, a portion of the system 500 in accordance with an embodiment of the present invention is described. The system 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. The system 500 may be used in any of the following systems: a wireless local area network (WLAN) system, a wireless personal area network (WPAN) system, or a cellular network, although the scope of the present invention is not limited in this respect.

The system 500 may include a controller 510, an input/output (I/O) device 520 (e.g., a keypad display), a memory 530, and a wireless interface 540 coupled to each other via a bus 550. It should be noted that the scope of the present invention is not limited to embodiments having any or all of these components.

The controller 510 may comprises, for example, one or more microprocessors, digital signal processors, microcontrollers, or the like. The memory 530 may be used to store messages transmitted to or by the system. The memory 530 may also be optionally used to store instructions that are executed by the controller 510. During the operation of the system 500 it may be used to store user data. The memory 530 may be provided by one or more different types of memory. For example, a memory 530 may comprise a volatile memory (any type of random access memory), a non-volatile memory such as a flash memory, and/or phase change memory that includes a memory such as, for example, memory element 16 and access device 14.

The I/O device 520 may be utilized to generate a message. The system 500 may use the wireless interface 540 to transmit and receive messages to and from a wireless communication network with a wireless radio frequency (RF) signal. Examples of the wireless interface 540 may include an antenna or a wireless transceiver, such as a dipole antenna, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A memory comprising:
   a cell including a chalcogenide access device and a memory element, the chalcogenide access device having a snapback voltage low enough to avoid disturbing data stored in the memory element while reading the memory element.

2. The memory of claim 1 wherein said chalcogenide access device has a snapback voltage less than the threshold voltage of the memory element.

3. The memory of claim 2 wherein said memory element includes a phase change material.

4. The memory of claim 2 wherein said memory element includes a thin film material.

5. The memory of claim 1 including at least two memory arrays, each array including a plurality of cells stacked one on top of the other.

6. The memory of claim 5 including at least two memory elements each having a chalcogenide access device.

7. The memory of claim 6 including a semiconductor substrate, said chalcogenide access devices of said two memory elements formed above said semiconductor substrate.

8. The memory of claim 7 wherein said two memory elements are formed above said semiconductor substrate.

9. The memory of claim 8 including an access device located over at least one of the two memory elements.

10. The memory of claim 9 wherein the access device is directly on top of the memory element.

11. A system comprising:

a processor-based device;

a wireless interface coupled to said processor-based device; and a memory coupled to said device, said memory including a cell with a chalcogenide access device and a memory element, the chalcogenide access device having a snapback voltage low enough to avoid disturbing data stored in the memory element while reading the memory element.

12. The system of claim 11 wherein said chalcogenide access device has a snapback voltage less than the threshold voltage of the memory element.

13. The system of claim 12 wherein said memory element includes a phase change material.

14. The system of claim 11 wherein said memory includes at least two arrays each having rows and columns, one of said arrays stacked above the other of said arrays.

15. The system of claim 14 including two memory elements each having a chalcogenide access device.

16. The system of claim 15 including a substrate, said chalcogenide access devices formed above said substrate.

17. The system of claim 16 wherein said memory elements are formed above said semiconductor substrate.

18. The system of claim 17 including an access device located over the memory element.

19. The system of claim 18 wherein the access device is directly on top of the memory element.

20. The system of claim 11 wherein said access device and said memory element include chalcogenide material and the chalcogenide material used in the access device and the memory element are different chalcogenide materials.

21. The system of claim 11 wherein said wireless interface includes a dipole antenna.

* * * * *